United States Patent

Kumar et al.

[11] Patent Number: 6,066,561
[45] Date of Patent: May 23, 2000

[54] APPARATUS AND METHOD FOR ELECTRICAL DETERMINATION OF DELAMINATION AT ONE OR MORE INTERFACES WITHIN A SEMICONDUCTOR WAFER

[75] Inventors: Kiran Kumar, San Jose; David J. Heine, Pleasanton, both of Calif.

[73] Assignee: LSI Logic Corporation, Milpitas, Calif.

[21] Appl. No.: 08/995,260

[22] Filed: Dec. 19, 1997

[51] Int. Cl.[7] .................................................. H01L 21/00
[52] U.S. Cl. ........................... 438/689; 438/14; 438/742; 324/765
[58] Field of Search ..................................... 257/414, 415, 257/417; 324/765, 766, 59; 216/61, 84, 86; 156/64, 344; 438/8, 9, 10, 14, 17, 689, 720, 742, 754

[56] References Cited

U.S. PATENT DOCUMENTS 5,042,148 8/1991 Tada et al. ................................. 216/53

*Primary Examiner*—William Powell
*Attorney, Agent, or Firm*—Conley, Rose & Tayon, PC; B. Noel Kivlin

[57] ABSTRACT

An apparatus and method are presented for electrically determining whether delamination has occurred at one or more interfaces within a semiconductor wafer. The semiconductor wafer includes a test structure formed within dielectric layers upon an upper surface of a semiconductor substrate. The test structure includes an electrically conductive structure, a pair of electrically conductive contact plugs, and a probe pad. The conductive structure is formed within an opening in a first dielectric layer, and is in electrical contact with the upper surface of the semiconductor substrate. The conductive structure is preferably made up of the same vertical stack of layers of selected electrically conductive materials used to form interconnects within the semiconductor wafer. A second dielectric layer if formed over the first dielectric layer and the conductive structure. The pair of electrically conductive contact plugs extend vertically through respective holes in the second dielectric layer. An electrically conductive probe pad is formed upon an upper surface of the second dielectric layer and extends between the pair of contact plugs. Each contact plug is in electrical contact with the probe pad and the electrically conductive structure. During testing, a probe of a measurement device is brought into contact with the probe pad. The measurement device measures the electrical resistance and/or reactance between the probe pad and the semiconductor substrate. The resulting resistance and/or reactance measurement may be compared to an expected resistance and/or reactance value to determine if delamination has occurred at one or more interfaces within the semiconductor wafer.

14 Claims, 2 Drawing Sheets

APPARATUS AND METHOD FOR ELECTRICAL DETERMINATION OF DELAMINATION AT ONE OR MORE INTERFACES WITHIN A SEMICONDUCTOR WAFER

BACKGROUND OF THE INVENTION

1. Field of the Invention

This invention relates to integrated circuit manufacturing, and more particularly to the detection of a lack of adhesion (i.e., delamination) at interfaces within a processed semiconductor wafer.

2. Description of the Relevant Art

An integrated circuit consists of electronic devices electrically coupled by conductive trace elements, often called interconnect lines (i.e., interconnects). Interconnects are patterned from conductive layers formed on or above the surface of a silicon substrate. One or more conductive layers may be patterned to form one or more levels of interconnects vertically spaced from each other by one or more interlevel dielectric layers. Common materials for interlevel dielectric layers include silicon dioxide (i.e., oxide), silicon nitride, and polyimide. Dielectric-spaced interconnect levels allow formations of densely patterned devices on relatively small surface areas. Interconnects on different levels are commonly coupled electrically using contact structures formed in vias (i.e., holes etched through the interlevel dielectric layers separating the interconnects).

The operating speed of an integrated circuit is limited by transistor switching times and signal propagation delays associated with signal lines along one or more critical signal paths through the circuit. A signal line formed between input/output terminals of an integrated circuit comprises interconnects arranged on one or more levels, connected by contact structures (i.e., contacts) disposed between the interconnect levels. The resistance of each signal line is equal to the sum of the resistance values of the interconnect lines and the contacts making up the signal line.

As feature sizes shrink, transistor switching times typically decrease while signal propagation delays of signal lines typically increase. In fact, the maximum operating speeds of integrated circuits with submicron feature sizes are typically limited by signal propagation delays associated with signal lines. Thus if the maximum operating speeds of integrated circuits are to increase as device dimensions shrink, the resistance values associated with interconnect lines and contacts must also be reduced to achieve a desired increase in operating speed.

Interconnect lines may be formed by stacking layers of various electrically conductive materials (e.g., metals) on top of one another. Currently, such metal stacks commonly include titanium (Ti), aluminum (Al), copper (Cu), tungsten (W), and alloys of these metals. One important characteristic of an interconnect line is that it must adhere to underlying structures (e.g., an interlevel dielectric layer, single and polycrystalline silicon, metallic silicides, etc.). Multiple interfaces are created within interconnect lines formed by such vertical stacking of layers of conductive materials. Stresses develop across each interface to accommodate the differences in microstructures and other properties including thermal expansion coefficients. These stresses can lead to a loss of adhesion at one or more of the interfaces (i.e., delaminations at one or more of the interfaces). In addition, contamination of an interface during manufacture may also lead to subsequent delamination at the interface.

Delamination at any such interface may deleteriously affect the operation and reliability of a device including the interconnect line. Currently, the only methods for determining whether delamination has occurred include optical and electron microscopy. Both techniques are slow and time consuming, allowing only a limited portion of an integrated circuit to be examined in a reasonable amount of time. Thus current techniques for determining whether delamination has occurred cannot be used efficiently in a manufacturing environment subject to volume production.

It would be beneficial to have a test structure and associated method which allow a quick and easy determination of whether delamination has occurred within an interconnect line formed by stacking layers of various conductive materials. Such a test structure and method would be useful in manufacturing environments where integrated circuits are produced in volume.

SUMMARY OF THE INVENTION

The problems outlined above are in large part solved by an apparatus and method for electrically determining whether delamination has occurred at one or more interfaces within a semiconductor wafer. The semiconductor wafer includes a test structure formed within dielectric layers upon an upper surface of a semiconductor substrate. The test structure includes an electrically conductive structure, a pair of electrically conductive contact plugs, and an electrically conductive probe pad.

The conductive structure is preferably made up of the same vertical stack of layers of selected electrically conductive materials used to form interconnects within the semiconductor wafer. For example, the conductive structure may include a titanium layer formed upon the upper surface of the semiconductor substrate, a titanium nitride layer formed upon the titanium layer, and a tungsten layer formed upon the titanium nitride layer. The conductive structure is formed within an opening in a first dielectric layer, and is in electrical contact with the upper surface of the semiconductor substrate. The conductive structure is preferably substantially straight and longer than it is wide (i.e., bar-shaped).

A second dielectric layer if formed over the first dielectric layer and the conductive structure. The pair of electrically conductive contact plugs extend vertically through respective holes in the second dielectric layer. An electrically conductive probe pad is formed upon an upper surface of the second dielectric layer and extends between the pair of contact plugs. Each contact plug is in electrical contact with the probe pad and the electrically conductive structure. The contact plugs are preferably laterally spaced from one another such that two different current paths are created through the test structure during testing.

An exemplary test apparatus includes a measurement device and an electrically conductive wafer chuck. The measurement device has a first lead connected to a probe and a second ground lead. The measurement device measures the electrical resistance and/or reactance of a specimen placed between the first and second leads.

An exemplary test method includes placing an underside surface of a semiconductor wafer including the above described test structure upon the wafer chuck. The ground lead of the measurement device is connected to the wafer chuck, and the wafer chuck is preferably connected to an electrical ground potential. The probe of the measurement device is brought into electrical contact with the probe pad of the test structure, coupling the measurement device between the probe pad and the wafer chuck. The measurement device measures the electrical resistance and/or reactance between the probe pad and the semiconductor substrate. The resulting resistance and/or reactance measurement may be compared to an expected resistance and/or reactance value to determine if delamination has occurred at one or more interfaces within the semiconductor wafer.

BRIEF DESCRIPTION OF THE DRAWINGS

Other objects and advantages of the invention will become apparent upon reading the following detailed description and upon reference to the accompanying drawings in which:

FIG. 1b is an expanded view of the electrically conductive structure as indicated in FIG. 1a, wherein FIG. 1b illustrates one embodiment of the electrically conductive structure wherein the electrically conductive structure is a vertical stack including a titanium (Ti) layer, a titanium nitride (TiN) layer, and a tungsten (W) layer;

Figure 1A:
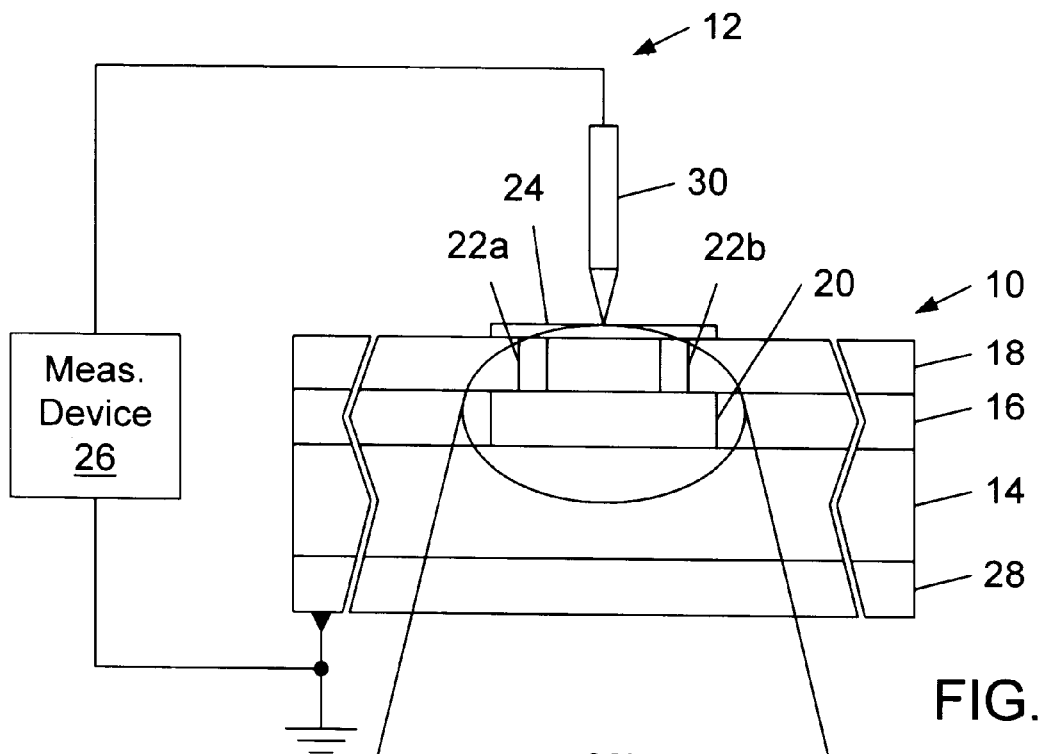
FIG. 1a is a cross-sectional view of a semiconductor wafer undergoing testing using a test apparatus in accordance with the present invention to determine whether delamination has occurred at one or more interfaces within the semiconductor wafer, wherein the semiconductor wafer includes a test structure, and wherein the test structure includes an electrically conductive structure in contact with a semiconductor substrate, a pair of electrically conductive contact plugs, and a probe pad.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 1a is a cross-sectional view of a semiconductor wafer 10 undergoing testing using a test apparatus 12 in accordance with the present invention to determine whether delamination has occurred at one or more interfaces within semiconductor wafer 10. Semiconductor wafer 10 includes a semiconductor substrate 14, a first dielectric layer 16, a second dielectric layer 18, and a test structure. The test structure includes an electrically conductive structure 20, a pair of electrically conductive contact plugs 22a and 22b (collectively referred to as contact plugs 22), and an electrically conductive probe pad 24.

Formation of the test structure during the processing of semiconductor wafer 10 will now be described. As a first step, first dielectric layer 16 is formed upon an upper surface of semiconductor substrate 14. First dielectric layer 16 may be, for example, a layer of silicon dioxide (oxide). Alternately, first dielectric layer 16 may be a layer of silicon nitride or polyimide.

Following the formation of first dielectric layer 16, an opening is created therethrough. The opening is preferably substantially straight and longer than it is wide, resembling a "trench". Such an opening may be created using, for example, an etch process. A portion of the upper surface of semiconductor substrate 14 is exposed though the opening.

Electrically conductive structure 20 is then formed within the opening such that structure 20 is in electrical contact with the upper surface of semiconductor substrate 14. Structure 20 is preferably a bar-shaped structure formed from one or more electrically conductive materials. In a preferred embodiment, structure 20 is a vertical stack of layers of selected electrically conductive materials as will be described in more detail below.

Following the formation of structure 20, second dielectric layer 18 is formed over first dielectric layer 16 and structure 20. Second dielectric layer 18 may be, for example, a layer of silicon dioxide (oxide). Alternately, second dielectric layer 18 may be a layer of silicon nitride or polyimide.

A pair of vertical holes are then formed through second dielectric layer 18. The vertical holes may formed using an etch process. Each vertical hole extends through the second dielectric layer, exposing portions of an upper surface of structure 20. The pair of holes are preferably laterally spaced from one another (i.e., located at opposite ends of bar-shaped structure 20) for reasons explained below.

Electrically conductive contact plugs 22a and 22b are then formed within a respective one of the pair of vertical holes. Each conductive plug 22 extends between an upper surface of second dielectric layer 18 and an upper surface of structure 20, and is in electrical contact with structure 20. Contact plugs 22 may be formed, for example, by first depositing an adhesion layer of titanium nitride (TiN) over the upper surface of second dielectric layer 18 and along the inner walls of each of the vertical holes, depositing a layer of tungsten (W) over the TiN layer such that the vertical holes are substantially filled with W, then removing the portions of the TiN and W layers upon the horizontal upper surface of second dielectric layer 18.

Electrically conductive probe pad 24 is then formed upon the upper surface of second dielectric layer 18. Probe pad 24 extends between contact plugs 22a and 22b, and is in electrical contact with each contact plug 22. Probe pad 24 is preferably formed by patterning a layer of aluminum deposited upon the upper surface of second dielectric layer 18.

Probe pad 24 may be formed before, during, or after the formation of a first interconnect layer upon the upper surface of second dielectric layer 18. The makeup of the first and any subsequent interconnect layers preferably matches the makeup of structure 20 such that any delamination in an interconnect layer results in a corresponding delamination within structure 20. In this way, the test structure may be used to determine any delaminations occurring within the interconnect layers.

Test apparatus 12 includes a measurement device 26 and an electrically conductive wafer chuck 28. Measurement device 26 has a first lead connected to a probe 30 and a second ground lead. The operation of test apparatus 12 will be described in more detail below.

Figure 1B:
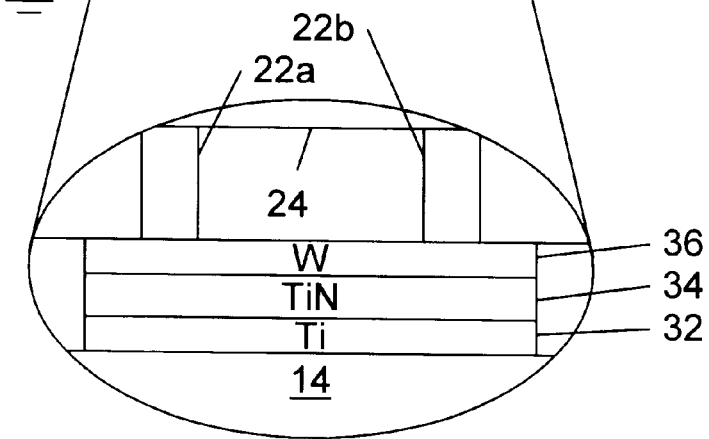

FIG. 1b is an expanded view of structure 20 as indicated in FIG. 1a. FIG. 1b illustrates one embodiment of structure 20 in which structure 20 is a vertical stack of layers of selected electrically conductive materials. In FIG. 1b, the vertical stack includes a titanium (Ti) layer 32, a TiN layer 34, and a W layer 36. Semiconductor substrate 14 is made of silicon (Si). During an exemplary formation of structure 20, Ti layer 32 and TiN layer 34 are deposited in that order over the upper surface of first dielectric layer 16 and within the opening formed through first dielectric layer. TiN layer 34 may be deposited using, for example, chemical vapor deposition (CVD) or physical vapor deposition (PVD). Semiconductor wafer 10 is then subjected to a heating step during which Ti of Ti layer 32 reacts with Si of semiconductor substrate 14 to form titanium silicide ($TiSi_2$) at the interface between Ti layer 32 and substrate 14. The formation of $TiSi_2$ lowers the electrical resistance between Ti layer 32 and substrate 14. A layer of W is then deposited over the upper surface of TiN layer 34. The portions of Ti layer 32, TiN layer 34, and W layer 36 upon the horizontal upper surface of first dielectric layer 16 are then removed. The remaining portions of Ti layer 32, TiN layer 34, and W layer 36 within the opening through first dielectric layer 16 forms structure 20 as shown.

Referring back to FIG. 1, a test method to determine whether delamination has occurred at one or more interfaces within semiconductor wafer 10 will now be described. The test structure described above is first formed upon an upper surface of semiconductor substrate 14 of semiconductor wafer 10. An underside surface of semiconductor wafer 10 is then positioned upon electrically conductive wafer chuck 28. The ground lead of measurement device 26 is connected to wafer chuck 28. Wafer chuck 28 is preferably connected to an electrical ground potential as shown. Probe 30 is brought into electrical contact with probe pad 24, coupling measurement device 26 between probe pad 24 and wafer chuck 28.

Measurement device 26 measures the electrical resistance and/or reactance of a specimen placed between the first and second leads. For example, measurement device 26 may be an ohmmeter which measures resistance, a capacitance meter which measures capacitive reactance, or an impedance bridge which measures both resistance and reactance. Positioned as described above, measurement device 26 measures the electrical resistance and/or reactance between probe pad 24 and semiconductor substrate 14. The resulting resistance and/or reactance measurement may be compared to an expected resistance and/or reactance value to determine if delamination has occurred at one or more interfaces within semiconductor wafer 10.

Figure 2:
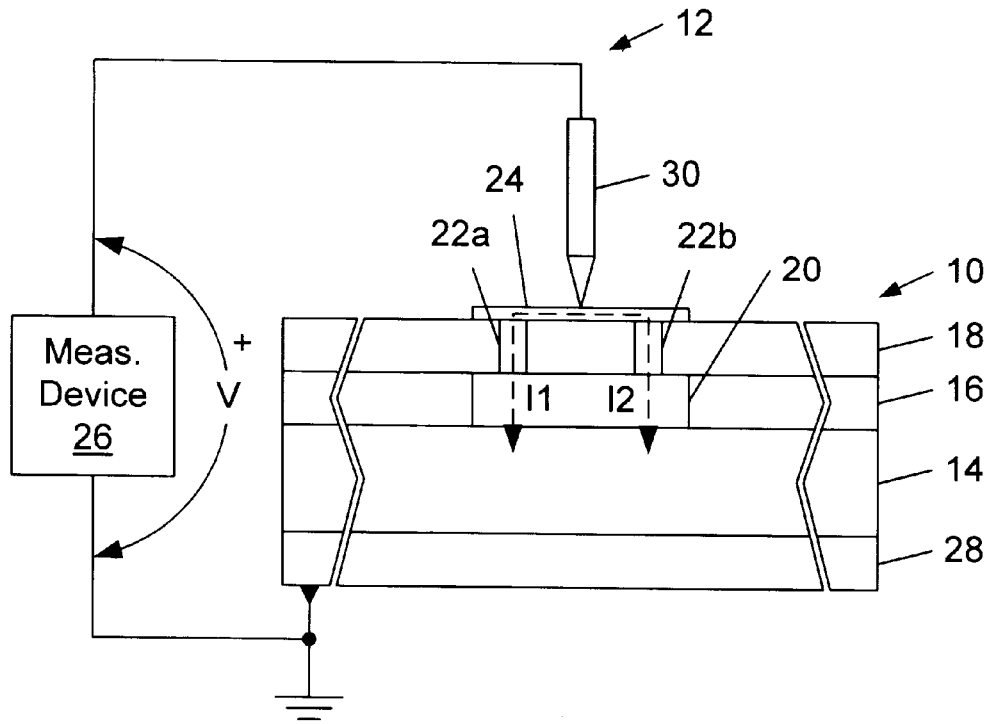
FIG. 2 is a cross-sectional view of the semiconductor wafer undergoing testing, wherein no delaminations exist at any of the interfaces within the semiconductor wafer, and wherein a measurement device impresses a voltage V between the probe pad and the semiconductor substrate, and wherein voltage V causes a current $I_1$ to flow from the probe pad through a first contact plug to the semiconductor substrate and a current $I_2$ to flow from the probe pad through a second contact plug to the semiconductor substrate, and wherein the measurement device measures the resistance between the probe pad and the semiconductor substrate, and wherein the measured resistance may be used as an expected value for future measurements.

FIG. 2 is a cross-sectional view of semiconductor wafer 10 undergoing testing. No delaminations exist at any of the interfaces within semiconductor wafer 10. Measurement device 10 impresses a voltage between probe pad 24 and semiconductor substrate 14. Voltage V causes a current to flow between probe pad 24 and semiconductor substrate 14. Probe 30 preferably contacts the center of probe pad 24 as shown. Contact plugs 22a and 22b are preferably laterally spaced from one another such that two different current paths are created through the test structure. A current $I_1$ flows from probe pad 24 through contact plug 22a to semiconductor substrate 14, and a current $I_2$ flows from probe pad 24 through contact plug 22b to semiconductor substrate 14.

Measurement device 26 may determine the electrical resistance between probe pad 24 and semiconductor substrate 14 by measuring a current flowing between probe pad 24 and semiconductor substrate 14 with voltage V applied. The current flowing between probe pad 24 and semiconductor substrate 14 is the sum of currents $I_1$ and $I_2$. Dividing voltage V by the measured current determines the resistance between probe pad 24 and substrate 14. In this case, the electrical resistance $R_1$ between probe pad 24 and semiconductor substrate 14 in FIG. 2 is given by:

$$R_1 = V|(I_1+I_2)$$

As no delaminations exist at any of the interfaces within semiconductor wafer 10 in FIG. 2, the electrical resistances along the two paths through contact plugs 22a–b are substantially equal, and currents $I_1$ and $I_2$ are substantially equal. The recorded value of $R_1$ may serve as an expected resistance value for future comparisons.

Figure 3:
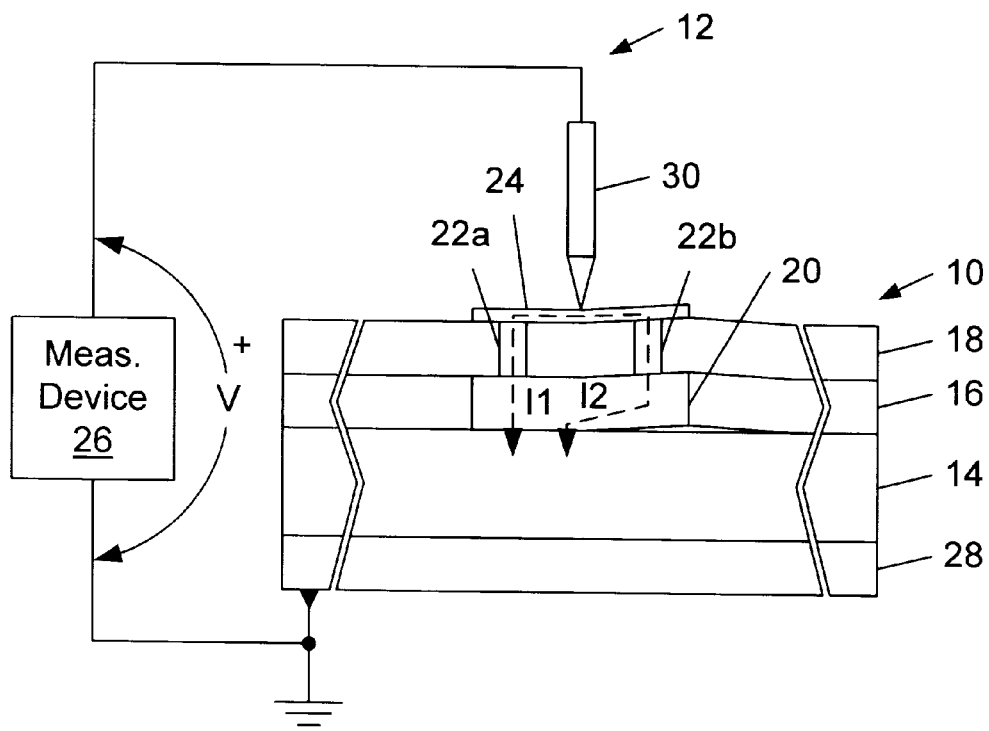
FIG. 3 is a cross-sectional view of the semiconductor wafer undergoing testing, wherein a delamination exists at an interface between the electrically conductive structure and the semiconductor substrate directly below the second contact plug, and wherein current $I_1$ flows from the probe pad through the first contact plug to the semiconductor substrate as in FIG. 2, and wherein a current $I_2'$ flows from the probe pad through the second contact plug to the semiconductor substrate, and wherein as a result of the delamination the path taken by current $I_2'$ through the second contact plug is longer than the path taken by current $I_1$, and wherein the electrical resistance of the path taken by current $I_2'$ is greater than the path taken by current $I_1$, and wherein the electrical resistance of the test structure is greater than the resistance of the test structure of FIG. 2.

FIG. 3 is a cross-sectional view of semiconductor wafer 10 undergoing testing. A delamination exists at the interface between structure 20 and semiconductor substrate 14 directly below contact plug 22b as shown. As before, current $I_1$ flows from probe pad 24 through contact plug 22a to semiconductor substrate 14. In this case, however, a current $I_2'$ flows from probe pad 24 through contact plug 22b to semiconductor substrate 14. As a result of the delamination, the path taken by current $I_2'$ through contact plug 22b to semiconductor substrate 14 is longer than the path taken by current $I_1$, and the electrical resistance of the path taken by current $I_2'$ is greater than the path taken by current $I_1$. The electrical resistance $R_2$ between probe pad 24 and semiconductor substrate 14 in FIG. 3 is given by:

$$R_2 = V|(I_1+I_2)$$

Due to the delamination, the value of $R_2$ is significantly greater than the value of $R_1$. Thus a comparison of $R_2$ to $R_1$ may be used to determine whether delamination has occurred at one or more interfaces within semiconductor wafer 10.

It is noted that the electrical impedance of the test structure in FIG. 3 is also greater than the impedance of the test structure in FIG. 2. In addition to the resistance, the capacitive reactance between probe pad 24 and semiconductor substrate 14 in FIG. 3 is also expected to be greater than that of the test structure in FIG. 2 due to the delamination at the interface between structure 20 and semiconductor substrate 14. Thus a comparison of impedances and/or reactances may also be used to determine whether delamination has occurred at one or more interfaces within semiconductor wafer 10.

It will be appreciated by those skilled in the art having the benefit of this disclosure that this invention is believed to be an apparatus and method for electrical determination of delamination at one or more interfaces within a semiconductor wafer. Furthermore, it is also to be understood that the form of the invention shown and described is to be taken as exemplary, presently preferred embodiments. Various modifications and changes may be made without departing from the spirit and scope of the invention as set forth in the claims.

It is intended that the following claims be interpreted to embrace all such modifications and changes.

What is claimed is:

1. A semiconductor wafer, comprising:
   a semiconductor substrate;
   a first dielectric layer formed upon an upper surface of the semiconductor substrate, wherein the first dielectric layer has an opening extending therethrough;
   an electrically conductive structure formed within the opening and in electrical contact with the upper surface of the semiconductor substrate;
   a second dielectric layer formed over the first dielectric layer and the electrically conductive structure, wherein the second dielectric layer has a pair of laterally spaced vertical holes located above the electrically conductive structure and extending through the second dielectric layer;
   a pair of electrically conductive contact plugs, wherein each contact plug is formed within a respective one of said pair of vertical holes and extends between an upper surface of the second dielectric layer and an upper surface of the electrically conductive structure, and wherein each contact plug is in electrical contact with the electrically conductive structure; and
   an electrically conductive probe pad formed upon an upper surface of the second dielectric layer and extending between the pair of contact plugs, wherein the probe pad is in electrical contact with each contact plug.

2. The semiconductor wafer as recited in claim 1, wherein the electrically conductive structure is a bar comprising a vertical stack of layers of selected electrically conductive materials.

3. The semiconductor wafer as recited in claim 2, wherein the vertical stack of layers comprises a tungsten layer, a titanium nitride layer, and a titanium layer.

4. The semiconductor wafer as recited in claim 3, wherein the titanium layer is formed upon the upper surface of the semiconductor substrate, the titanium nitride layer is formed upon the titanium layer, and the tungsten layer is formed upon the titanium nitride layer.

5. The semiconductor wafer as recited in claim 1, wherein the first and second dielectric layers comprise materials selected from the group consisting of silicon dioxide, silicon nitride, and polyimide.

6. The semiconductor wafer as recited in claim 1, wherein each contact plug comprises tungsten.

7. The semiconductor wafer as recited in claim 1, wherein the probe pad comprises aluminum.

8. A method of determining whether delamination has occurred at one or more interfaces within a semiconductor wafer, comprising:
   providing a semiconductor wafer comprising a semiconductor substrate and having a test structure formed thereupon, wherein the test structure comprises:
      an electrically conductive structure formed within an opening in a first dielectric layer and in electrical contact with an upper surface of the semiconductor substrate;
      a pair of electrically conductive contact plugs, wherein each contact plug is formed within a respective one of a pair of vertical holes in a second dielectric layer, and wherein each contact plug extends between an upper surface of the second dielectric layer and an upper surface of the electrically conductive structure, and wherein each contact plug is in electrical contact with the electrically conductive structure; and
      an electrically conductive probe pad formed upon an upper surface of the second dielectric layer and extending between the pair of contact plugs, wherein the probe pad is in electrical contact with each contact plug;
   measuring the electrical resistance between the probe pad and the semiconductor substrate; and
   comparing the measured resistance to an expected resistance value to determine if delamination has occurred at one or more interfaces within the semiconductor wafer.

9. The method as recited in claim 8, wherein the electrically conductive structure is a bar comprising a vertical stack of layers of selected electrically conductive materials.

10. The method as recited in claim 9, wherein the vertical stack of layers comprises a tungsten layer, a titanium nitride layer, and a titanium layer.

11. The method as recited in claim 10, wherein the titanium layer is formed upon the upper surface of the semiconductor substrate, the titanium nitride layer is formed upon the titanium layer, and the tungsten layer is formed upon the titanium nitride layer.

12. The method as recited in claim 8, wherein the measuring comprises:
   applying a voltage between the probe pad and the semiconductor substrate;
   measuring a current flowing between the probe pad and the semiconductor substrate; and
   dividing the voltage by the measured current to determine the resistance between the probe pad and the substrate.

13. A method of determining whether delamination has occurred at one or more interfaces within a semiconductor wafer, comprising:
   providing a semiconductor wafer comprising a semiconductor substrate and having a test structure formed thereupon, wherein the test structure comprises:
      an electrically conductive structure formed within an opening in a first dielectric layer and in electrical contact with an upper surface of the semiconductor substrate;
      a pair of electrically conductive contact plugs, wherein each contact plug is formed within a respective one of a pair of vertical holes in a second dielectric layer, and wherein each contact plug extends between an upper surface of the second dielectric layer and an upper surface of the electrically conductive structure, and wherein each contact plug is in electrical contact with the electrically conductive structure; and
      an electrically conductive probe pad formed upon an upper surface of the second dielectric layer and extending between the pair of contact plugs, wherein the probe pad is in electrical contact with each contact plug;
   measuring the electrical reactance between the probe pad and the semiconductor substrate; and
   comparing the measured reactance to an expected reactance value to determine if delamination has occurred at one or more interfaces within the semiconductor wafer.

14. A method of determining whether delamination has occurred at one or more interfaces within a semiconductor wafer, comprising:
   providing a semiconductor wafer comprising a semiconductor substrate and having a test structure formed thereupon, wherein the test structure comprises:
      an electrically conductive structure formed within an opening in a first dielectric layer and in electrical contact with an upper surface of the semiconductor substrate;

a pair of electrically conductive contact plugs, wherein each contact plug is formed within a respective one of a pair of vertical holes in a second dielectric layer, and wherein each contact plug extends between an upper surface of the second dielectric layer and an upper surface of the electrically conductive structure, and wherein each contact plug is in electrical contact with the electrically conductive structure; and an electrically conductive probe pad formed upon an upper surface of the second dielectric layer and extending between the pair of contact plugs, wherein the probe pad is in electrical contact with each contact plug;

measuring the electrical impedance between the probe pad and the semiconductor substrate; and comparing the measured impedance to an expected impedance value to determine if delamination has occurred at one or more interfaces within the semiconductor wafer.

* * * * *